United States Patent
Kurita et al.

(10) Patent No.: US 7,838,884 B2
(45) Date of Patent: Nov. 23, 2010

(54) DISPLAY DEVICE AND FABRICATION METHOD OF DISPLAY DEVICE

(75) Inventors: Makoto Kurita, Mobara (JP); Jun Gotoh, Mobara (JP)

(73) Assignee: Hitachi Displays, Ltd., Tokyo (JP)

( * ) Notice: Subject to any disclaimer, the term of this patent is extended or adjusted under 35 U.S.C. 154(b) by 0 days.

(21) Appl. No.: 11/115,224

(22) Filed: Apr. 27, 2005

(65) Prior Publication Data
US 2005/0253147 A1    Nov. 17, 2005

(30) Foreign Application Priority Data
May 12, 2004    (JP)    .............................. 2004-142528

(51) Int. Cl.
 *H01L 29/10*    (2006.01)
(52) U.S. Cl. .................. 257/72; 257/59; 257/E21.413; 257/E21.414
(58) Field of Classification Search .................. 257/59, 257/72, 133; 349/42, 114; 438/151, 241
See application file for complete search history.

(56) References Cited

U.S. PATENT DOCUMENTS

| | | | |
|---|---|---|---|
| 5,150,233 A | | 9/1992 | Enomoto et al. |
| 5,543,357 A | * | 8/1996 | Yamada et al. .............. 438/646 |
| 5,543,946 A | * | 8/1996 | Enomoto et al. ............ 349/139 |
| 6,184,960 B1 | | 2/2001 | Sawayama et al. |
| 6,853,421 B2 | | 2/2005 | Sakamoto et al. |
| 2001/0002050 A1 | * | 5/2001 | Kobayashi et al. .......... 257/133 |
| 2003/0086046 A1 | * | 5/2003 | You ............................ 349/149 |
| 2003/0164350 A1 | * | 9/2003 | Hanson et al. ................. 216/2 |
| 2003/0201716 A1 | * | 10/2003 | Yamazaki et al. ........... 313/506 |
| 2004/0022664 A1 | * | 2/2004 | Kubota et al. ............... 420/550 |
| 2005/0186359 A1 | * | 8/2005 | Ishizuka et al. .............. 428/1.1 |
| 2006/0035174 A1 | * | 2/2006 | Huang et al. ................ 430/321 |
| 2006/0097260 A1 | * | 5/2006 | Huang .......................... 257/66 |
| 2006/0132685 A1 | * | 6/2006 | You ........................... 349/114 |
| 2007/0109455 A1 | * | 5/2007 | Kim et al. ..................... 349/43 |

FOREIGN PATENT DOCUMENTS

| | | | |
|---|---|---|---|
| JP | 10-173191 | * | 6/1998 |
| JP | 2000-180882 | | 12/1998 |
| JP | 2000-216158 | | 1/1999 |
| JP | 2003-273109 | * | 9/2003 |

* cited by examiner

*Primary Examiner*—Ahmed Sefer
(74) *Attorney, Agent, or Firm*—Stites & Harbison, PLLC; Juan Carlos A. Marquez, Esq

(57) ABSTRACT

The present invention provides a display device which can prevent the deterioration of a transparent conductive film attributed to a cell reaction without pushing up a cost of a film forming device. The display device includes a first conductive layer which is formed of a transparent conductive film containing indium oxide as a main component, a conductive background layer which is formed on the first conductive layer, a second conductive layer which is formed of a film containing Al as a main component on the background layer, and a third conductive layer which is formed of the same material as the second conductive layer on the second conductive layer. On an interface between the second conductive layer and the third conductive layer, positions of grain boundaries are arranged discontinuously. Further, the background layer is a film which contains any one of Mo, Ti and Ta as a main component. Still further, the third conductive layer is used as a reflective electrode.

9 Claims, 13 Drawing Sheets

DISPLAY DEVICE AND FABRICATION METHOD OF DISPLAY DEVICE

The present application claims priority from Japanese application JP2004-142528 filed on May 12, 2004, the content of which is hereby incorporated by reference into this application.

BACKGROUND OF THE INVENTION

1. Field of the Invention

The present invention relates to a display device and a fabrication method of a display device, and more particularly to the electrode (including wiring) structure which is used in a display device such as an active-matrix-type liquid crystal display or the like.

2. Description of the Related Art

In a field of the liquid crystal display device, Al is often used as a wiring material since Al is relatively inexpensive compared to other metals and exhibits the favorable adhesiveness with a film made of $SiN_x$ or the like.

Further, in the field of the liquid crystal display device as a material of transparent electrodes, a film containing indium oxide such as ITO (indium tin oxide) or the like, for example, as a main component is often used.

Here, in the conventional liquid crystal display device, in some cases, the two-layered electrode structure formed of Al film/ITO film is adopted as a reflective electrode of a partial-transmissive-type liquid crystal display device or connection terminal electrodes of the liquid crystal display device.

However, when the film which contains Al as the main component (Al film or Al alloy film) and the ITO film are exposed to an alkaline developer in a state that the Al film and the ITO film are electrically brought into contact with each other, a cell reaction is generated due to the relationship of oxidation/reduction potential and hence, there has been a drawback that Al is dissolved in the alkaline developer and, at the same time, indium oxide and tin oxide of the ITO film are reduced whereby the ITO film is dissolved.

That is, when the two-layered electrode structure formed of the Al film/ITO film constitutes the reflective electrode of the partial-transmissive-type liquid crystal display device, due to the dissolution of the ITO film, the brightness spot failure is generated in a liquid crystal display panel thus lowering a yield rate of the liquid crystal display panel.

As techniques for overcoming such a drawback, there have been known methods which are disclosed in Japanese Patent Laid-open Heill (1999)-281993 (patent literature 1), Japanese Patent Laid-open 2000-180882 (patent literature 2) and Japanese Patent Laid-open 2000-216158 (patent literature 3).

In the above-mentioned patent literature 1, the following method is disclosed. That is, a protective metal film (Mo system or Ti system) is formed such that the protective metal film covers the whole ITO film and, thereafter, an Al film of one layer is formed thus allowing the electrode structure to have the three-layered structure formed of Al film/protective metal film (Mo system or Ti system)/ITO film. With the provision of this protective metal film, in a photolithography step after forming the Al film, it is possible to suppress a phenomenon in which a developer dissolves the ITO film through pin holes or the like formed in Al.

Further, in the above-mentioned patent literature 2, the following method is disclosed. On an ITO film, a protective layer formed of Al—W alloy or Al—Mo alloy and an Al film are sequentially stacked thus allowing the electrode structure to have the three-layered structure formed of Al film/protective layer (Al—W alloy or Al—Mo alloy)/ITO film. With the provision of this protective layer, in a photolithography step after forming the Al film, it is possible to suppress a phenomenon in which a developer dissolves the ITO film through pin holes or the like formed in Al.

Further, in the above-mentioned patent literature 3, the following method is disclosed. That is, by sequentially stacking an Al film and $AlO_x$ film on an ITO film, the electrode structure is allowed to have the three-layered structure formed of $AlO_x$ film/Al film/ITO film. With the provision of the $AlO_x$ film on the surface, in a photolithography step after forming $AlO_x$ film, it is possible to suppress a phenomenon in which a developer dissolves the ITO film through pin holes or the like formed in Al.

Further, as a method for forming the film, following two types of techniques are disclosed.

(A) The Al film is formed by a sputtering method using Al as a target and, thereafter, the $AlO_x$ film is formed by a sputtering method using Al containing an oxygen element as a target.

(B) Using Al as a target, the Al film and the $AlO_x$ film are formed by a sputtering method while gradually adding oxygen into an Ar gas in the processing atmosphere.

SUMMARY OF THE INVENTION

In the above-mentioned patent literature 1, there is a description that with the formation of the protective metal film, it is possible to suppress the phenomenon that the developer reaches the ITO film. However, inventors of the present invention have found out, based on experiments, that the method described in the above-mentioned patent literature 1 exhibits an insufficient suppression effect.

Further, in the method described in the above-mentioned patent literature 2, since two Al layers which differ in material (that is, Al alloy layer and Al layer) are formed and hence, two film forming chambers, that is, a film forming chamber for forming a protective layer made of Al—W alloy or Al—Mo alloy and a film forming chamber for forming the Al layer become necessary thus giving rise to a drawback that a fabrication cost of a film forming device is pushed up.

Further, in the method of (A) described in the above-mentioned patent literature 3, since two Al layers which differ in target (material) (that is, the Al film and the $AlO_x$ film) are formed and hence, two film forming chambers are necessary in the same manner as the method described in the above-mentioned patent literature 2 thus giving rise to a drawback that the method leads to the increase of fabrication cost of the film forming device.

Further, in the method of (B) described in the above-mentioned patent literature 3, by adding oxygen in the processing film atmosphere, Al which constitutes the target is gradually oxidized when the processing is repeated and hence, the Al film cannot be formed thus giving rise to a drawback that the method is no applicable to the mass production.

The present invention has been made to overcome the above-mentioned drawbacks of the related art and it is an object of the present invention to provide a display device and a fabrication method of display device which is capable of preventing the deterioration of a transparent conductive film due to a cell reaction without pushing up a cost of a film forming device.

The above-mentioned and other objects and novel features will become apparent in conjunction with the description of the specification and attached drawings.

To explain the summary of representative inventions among the inventions disclosed in this specification, they are as follows.

To achieve the above-mentioned object, the display device of the present invention is characterized by including a first conductive layer which is formed of a transparent conductive film containing indium oxide as a main component, a conductive background layer which is formed on the first conductive layer, a second conductive layer which is formed of a film containing Al as a main component on the background layer, and a third conductive layer which is formed of the same material as the second conductive layer on the second conductive layer.

Further, the present invention is directed to a fabrication method of a display device which includes a first conductive layer which is formed of a transparent conductive film containing indium oxide as a main component, a conductive background layer which is formed on the first conductive layer, and a second conductive layer which is formed of a film containing Al as a main component on the background layer, wherein the improvement is characterized in that a third conductive layer which is formed of the same material as the second conductive layer is formed on the second conductive layer and, thereafter, a photolithography process is performed using an alkaline developer.

Further, the present invention is also characterized in that on an interface between the second conductive layer and the third conductive layer, positions of grain boundaries are arranged discontinuously.

Further, according to the present invention, it is preferable that the background layer is a film which contains any one of Mo, Ti and Ta as a main component.

Further, in one embodiment of the present invention, the third conductive layer is used as a reflective electrode.

To briefly explain advantageous effects obtained by the representative inventions disclosed in this specification, they are as follows.

According to the display device and the fabrication method of the display device according to the present invention, it is possible to prevent the deterioration of the transparent conductive film attributed to a cell reaction without pushing up a cost of a film forming device.

BRIEF DESCRIPTION OF THE DRAWINGS

FIG. 12A and FIG. 12B are views for explaining a developing step of a photoresist film formed on the reflective electrode described in the previously described patent literature 1;

DESCRIPTION OF THE PREFERRED EMBODIMENTS

Hereinafter, an embodiment in which the present invention is applied to a reflective electrode of a partial-transmissive-type liquid crystal display device is explained in detail in conjunction with drawings.

Here, in all drawings which explain the embodiment, parts having identical functions are given equal symbols and their repeated explanation is omitted.

Figure 1:
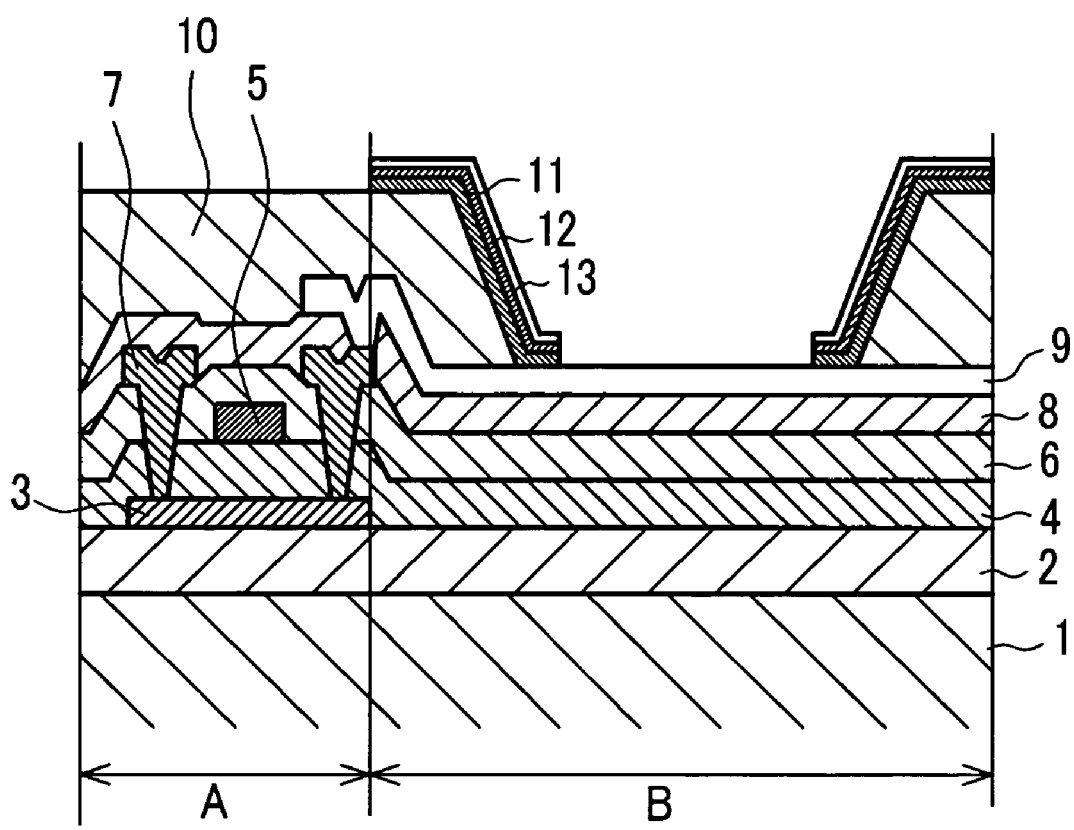
FIG. 1 is a cross-sectional view showing the cross-sectional structure of an essential part of a liquid crystal display device of an embodiment of the present invention.

FIG. 1 is a cross-sectional view showing the cross-sectional structure of an essential part of the liquid crystal display device of the embodiment of the present invention.

In the drawing, numeral 1 indicates a glass substrate, numeral 2 indicates a background layer, numeral 3 indicates a polysilicon layer, numeral 4 indicates a gate insulation film, numeral 5 indicates a gate electrode, numerals 6, 8 indicate insulation films, numeral 7 indicates source/drain electrodes, numeral 9 indicates a transparent electrode (ITO film), numeral 10 indicates an overcoat layer (organic insulation film), numeral 11 indicates a first-layer reflective electrode, numeral 12 indicates a second-layer reflective electrode, and numeral 13 indicates a third-layer reflective electrode. Further, in the drawing or FIG. 7C, FIG. 8A and FIG. 11A described later, symbol A indicates an active element portion, and symbol B indicates a pixel portion.

The liquid crystal display device of this embodiment is an active-matrix-type liquid crystal display device which uses thin film transistors (TFT) as active elements, wherein a channel layer of the thin film transistor is formed of polysilicon.

As mentioned previously, the liquid crystal display device of this embodiment is of the partial transmissive type and hence, the liquid crystal display device includes the transparent electrode 9 formed of the ITO film and the reflective electrode which is electrically connected with the transparent electrode 9.

In this embodiment, the reflective electrode is constituted of the first-layer reflective electrode 11 formed of a Mo alloy film, the second-layer reflective electrode 12 formed of an Al alloy film, and the third-layer reflective electrode 13 formed of the same material (here, Al alloy film) as the second-layer reflective electrode 12.

That is, the present invention adopts, as the electrode structure, the four-layered structure which is constituted of the third-layer reflective electrode 13 (Al alloy film)/the second-layer reflective electrode 12 (Al alloy film)/the first-layer reflective electrode 11 (Mo alloy film)/the transparent electrode 9 (ITO film).

Due to such a constitution, in this embodiment, on an interface between the second-layer reflective electrode 12 and the third-layer reflective electrode 13, discontinuous grain boundaries are formed and hence, it is possible to prevent the intrusion of an alkaline developer in a photolithography step described later whereby the dissolution of the ITO film which constitutes the lower transparent electrode 9 can be prevented.

Hereinafter, a fabrication process of the liquid crystal display device of this embodiment is explained.

Figure 2A:
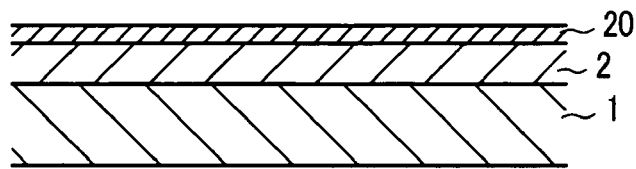
FIG. 2A to FIG. 2E are views for explaining a fabrication process of a liquid crystal display device of the embodiment of the present invention.

On the glass substrate 1, the background layer 2 is formed to prevent the Na contamination from glass and, an amorphous silicon film 20 is formed on the background layer 2 (see FIG. 2A).

Here, the background layer 2 has the two-layered structure which is constituted of a first-layer silicon nitride film and a second-layer silicon oxide film.

Figure 2B:
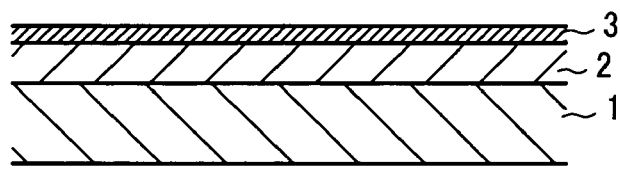

Next, using an excimer laser annealing (ELA) device, the amorphous silicon film 20 is crystallized on the polysilicon layer 3 (see FIG. 2B).

Figure 2C:
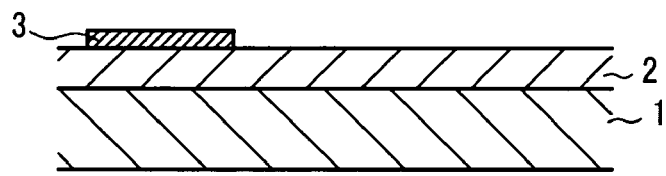
Figure 2D:
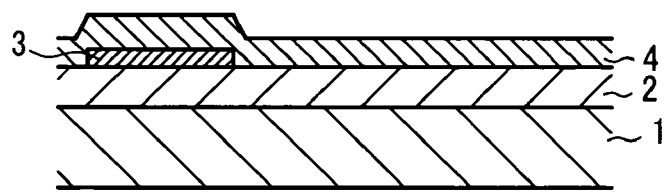

Then, the polysilicon layer 3 is formed in an island shape (see FIG. 2C) by photolithography etching and the gate insulation film 4 is formed on the polysilicon layer 3 (see FIG. 2D).

Figure 2E:
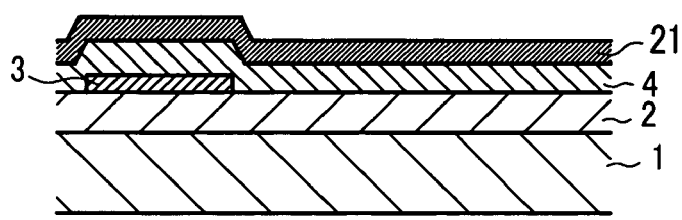

Subsequently, as a self-aligning LDD layer forming process, a gate electrode film 21 is formed (see FIG. 2E) and, thereafter, the gate electrode 5 is formed by photolithography etching. Here, side etching is performed by approximately 1 μm while leaving the resist film.

Figure 3A:
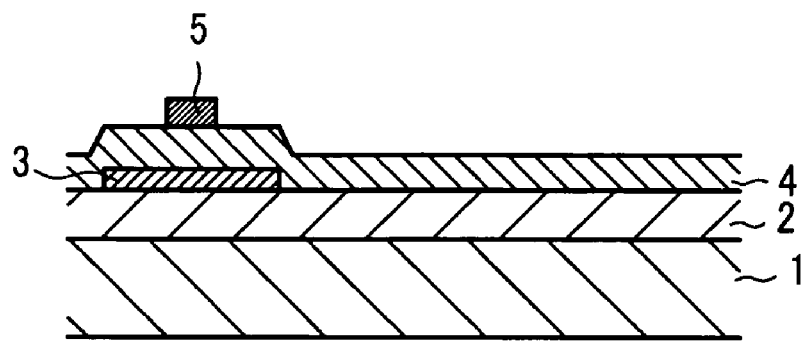
FIG. 3A to FIG. 3C are views for explaining the fabrication process of the liquid crystal display device of the embodiment of the present invention.

In such a state, the N implantation is performed so as to form source/drain regions in the polysilicon layer 3. After removing the resist film (see FIG. 3A), the NM implantation is performed by way of the gate electrode 5 to which the side etching is applied whereby LDD (Light Doped Drain) layers having the lower concentration than the source/drain regions are formed.

Figure 3B:
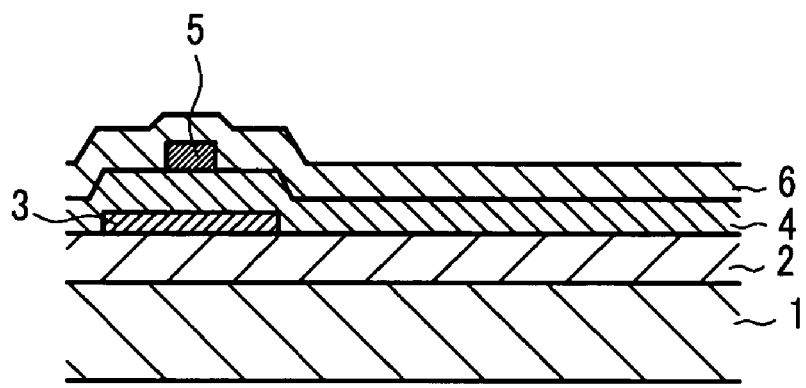
Figure 3C:
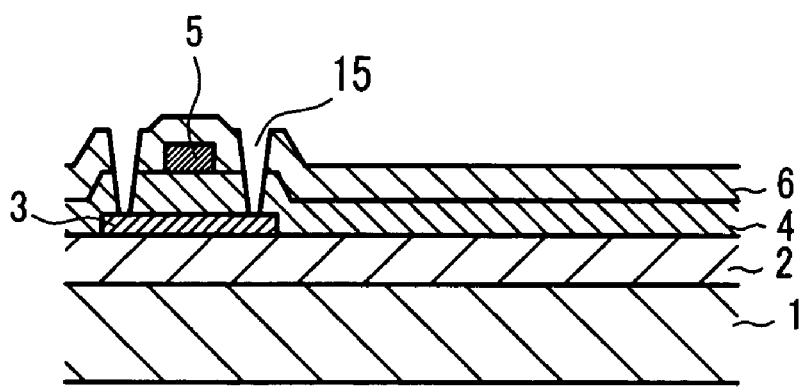

Further, the interlayer insulation film 6 is formed (see FIG. 3B) and, thereafter, through holes 15 are formed in the source/drain regions by photolithography etching (see FIG. 3C).

Figure 4A:
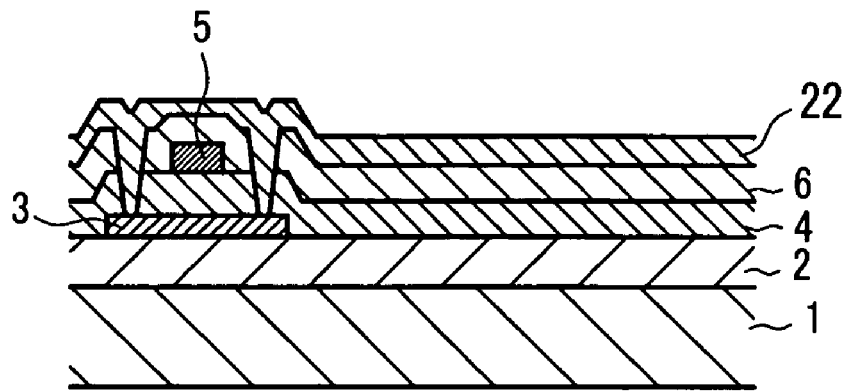
FIG. 4A to FIG. 4C are views for explaining the fabrication process of the liquid crystal display device of the embodiment of the present invention.
Figure 4B:
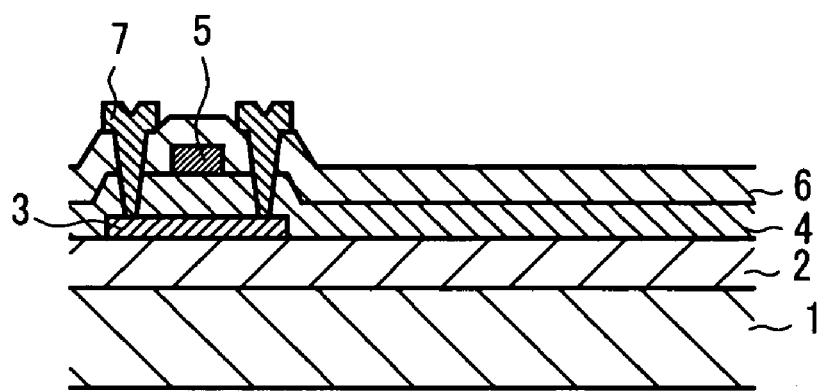

Next, a source/drain electrode film 22 is formed (see FIG. 4A) and, thereafter, the source/drain electrodes 7 are formed by photolithography etching (see FIG. 4B). Here, a video signal line not shown in the drawing is simultaneously formed.

Figure 4C:
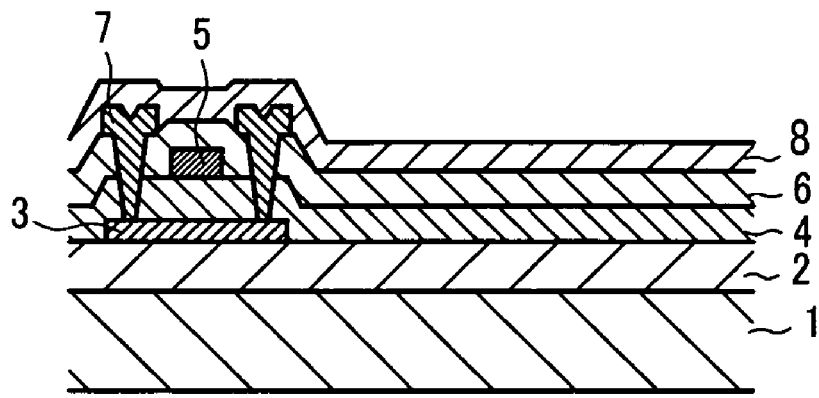
Figure 5A:
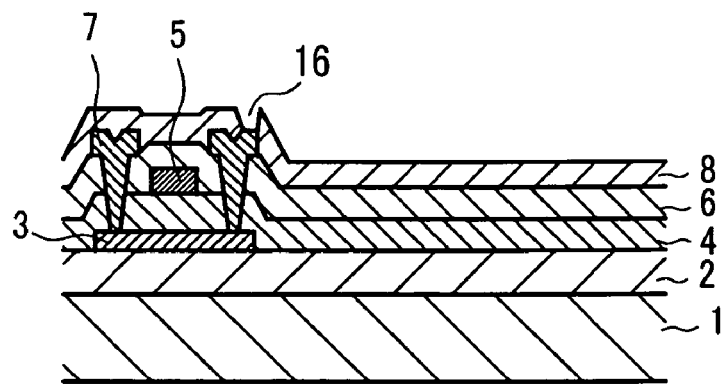
FIG. 5A to FIG. 5C are views for explaining the fabrication process of the liquid crystal display device of the embodiment of the present invention.
Figure 5B:
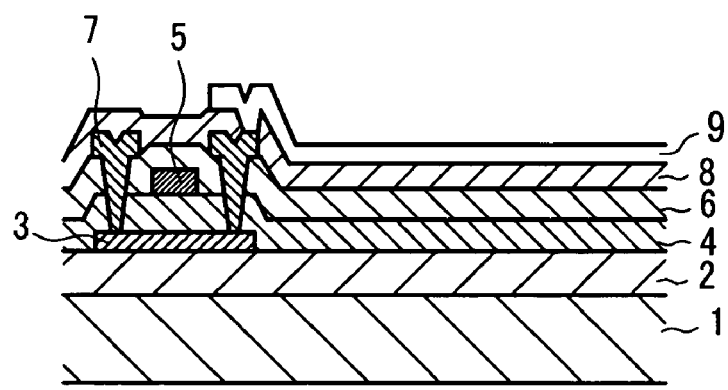

After forming the source/drain electrodes 7, the protective insulation film 8 is formed (see FIG. 4C), through holes 16 are formed in the protective insulation film 8 for bringing the source/drain electrodes 7 into contact with the transparent electrode (see FIG. 5A), and, thereafter, the film forming and the forming of the ITO film which becomes the transparent electrode 9 are performed (see FIG. 5B). This transparent electrode 9 becomes a pixel electrode.

Figure 5C:
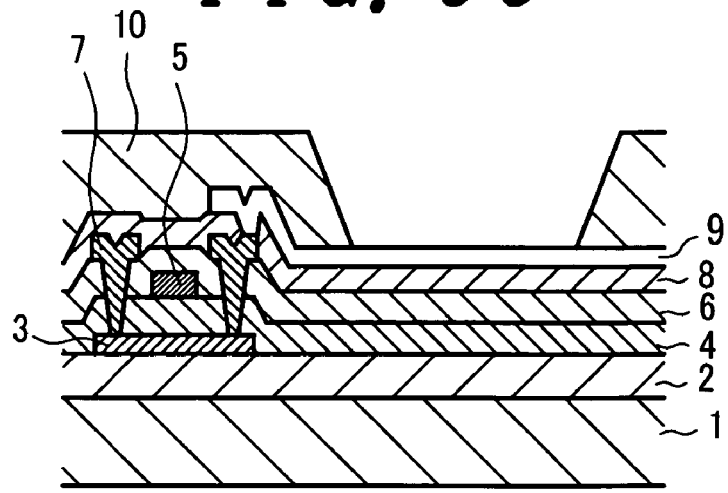

Next, as a layer on the transparent electrode (ITO film) 9, an overcoat layer (an organic leveling film) 10 is formed for enhancing the optical properties (see FIG. 5C). An opening portion is formed in the overcoat layer 10 to expose a portion of the transparent electrode 9.

Figure 6A:
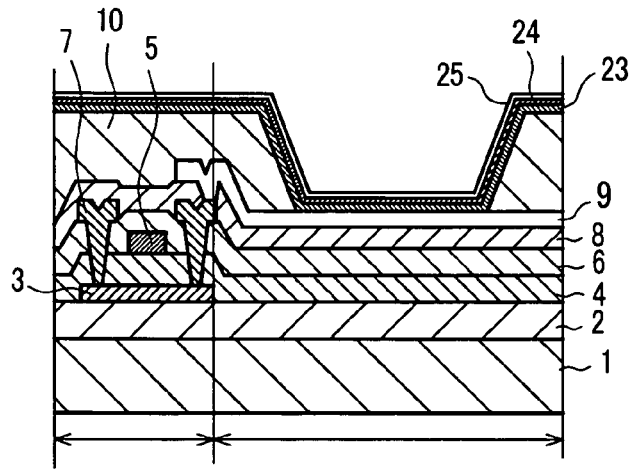
FIG. 6A to FIG. 6C are views for explaining the fabrication process of the liquid crystal display device of the embodiment of the present invention.

Thereafter, a Mo alloy film 23 which becomes the first-layer reflective electrode 11, an Al alloy film 24 which becomes the second-layer reflective electrode 12 and an Al alloy film 25 which becomes the third-layer reflective electrode 13 are formed (see FIG. 6A).

After forming the films of reflective electrodes, a reflective electrode pattern is formed by photolithography etching.

Figure 6B:
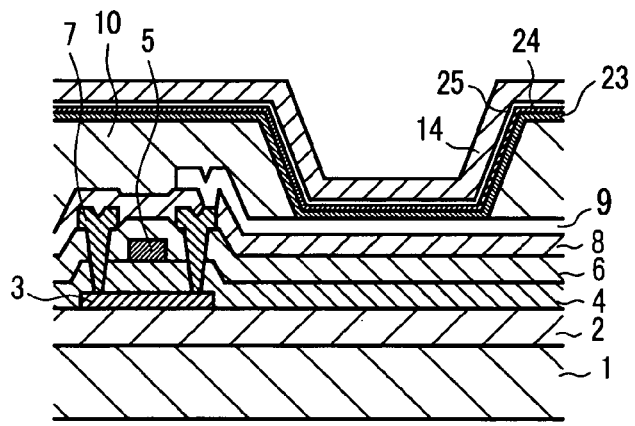
Figure 6C:
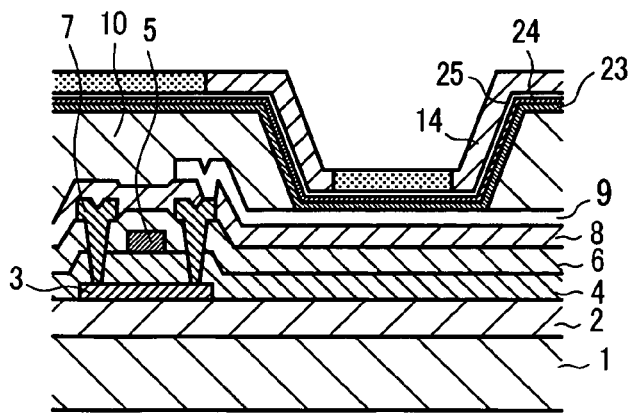

That is, after forming the films of the reflective electrodes, a photoresist film 14 is formed on the whole surface. After performing the exposure (see FIG. 6B, FIG. 6C), the developing is performed using an alkaline developer (see FIG. 7A). Using the photoresist film 14 as a mask, the first-layer Mo alloy film 23, the second-layer Al alloy film 24 and the third-layer Al alloy film 25 are etched to form the first-layer reflective electrode 11, the second-layer reflective electrode 12 and the third-layer reflective electrode 13 (see FIG. 7B).

Thereafter, the photoresist film 14 is removed (see FIG. 7C) thus completing the liquid crystal display device of this embodiment.

Figure 7A:
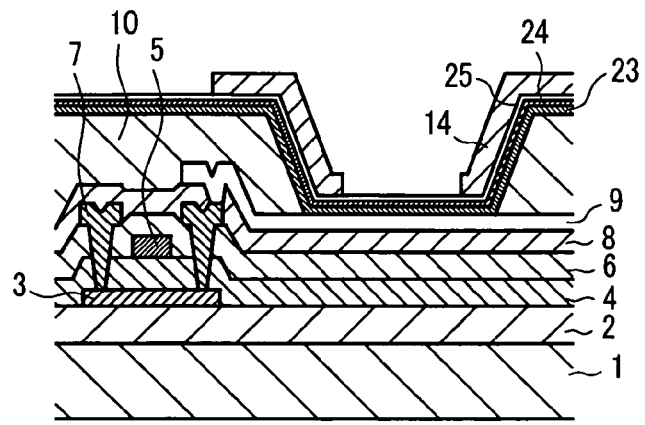
FIG. 7A to FIG. 7C are views for explaining the fabrication process of the liquid crystal display device of the embodiment of the present invention.
Figure 7B:
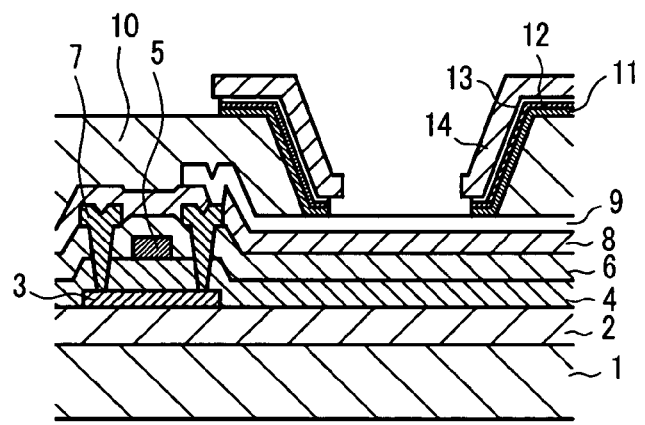
Figure 7C:
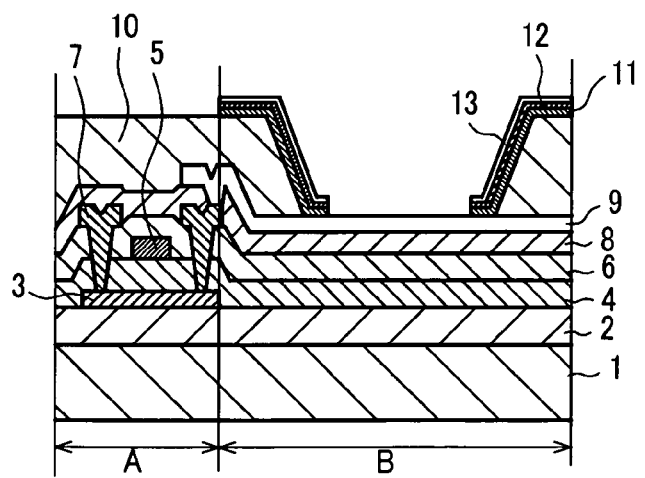
Figure 8A:
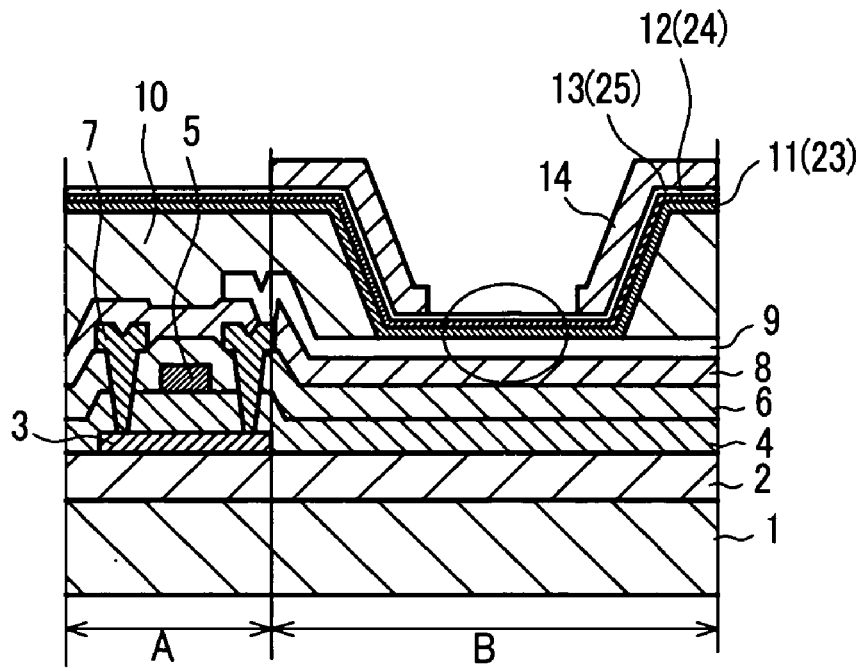
FIG. 8A and FIG. 8B are views for explaining grain boundaries formed by each reflective electrode in the liquid crystal display device of the embodiment of the present invention.
Figure 8B:
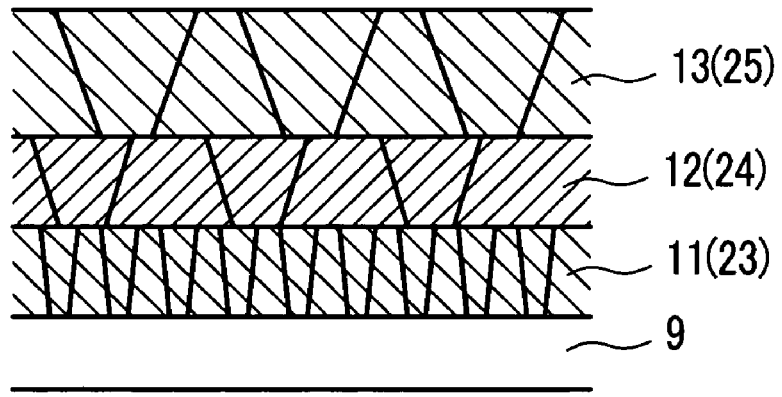

FIG. 8A and FIG. 8B are views for explaining grain boundaries which are formed between respective reflective electrodes of this embodiment. FIG. 8A shows the developing step of the photoresist film 14 shown in FIG. 7A and FIG. 8B is a view which shows a portion which is surrounded by a circle in FIG. 8A in an enlarged manner.

As shown in FIG. 8B, in this embodiment, the reflective electrode formed of the Al alloy film is formed as the divided films having the three-layered structure. Accordingly, the grain boundaries are formed in the Mo alloy film 23 which constitutes the first-layer reflective electrode 11, the Al alloy film 24 which constitutes the second-layer reflective electrode 12 and the Al alloy film 25 which constitutes the third-layer reflective electrode 13.

In this case, the discontinuous grain boundaries are formed on an interface between an upper layer of the Al alloy film 24 which constitutes the second-layer reflective electrode 12 and a lower layer of the Al alloy film 25 which constitutes the third-layer reflective electrode 13. In the photolithography step, these discontinuous grain boundaries prevent the intrusion of the alkaline developer and hence, it is possible to prevent the dissolution of the ITO film which constitutes the lower-layer transparent electrode 9.

Hereinafter, this point is explained in conjunction with FIG. 9A and FIG. 9B.

In this embodiment, the first-layer reflective electrode (Mo alloy layer) 11(23), the second-layer reflective electrode (Al alloy layer) 12(24) and the third-layer reflective electrode (Al alloy) 13(25) are continuously formed as films. Thereafter, for performing the patterning, the photoresist film 14 is applied using a coating developing device, is sensitized by exposure. Then, using an alkaline developer, the electrode pattern is formed.

Figure 9A:
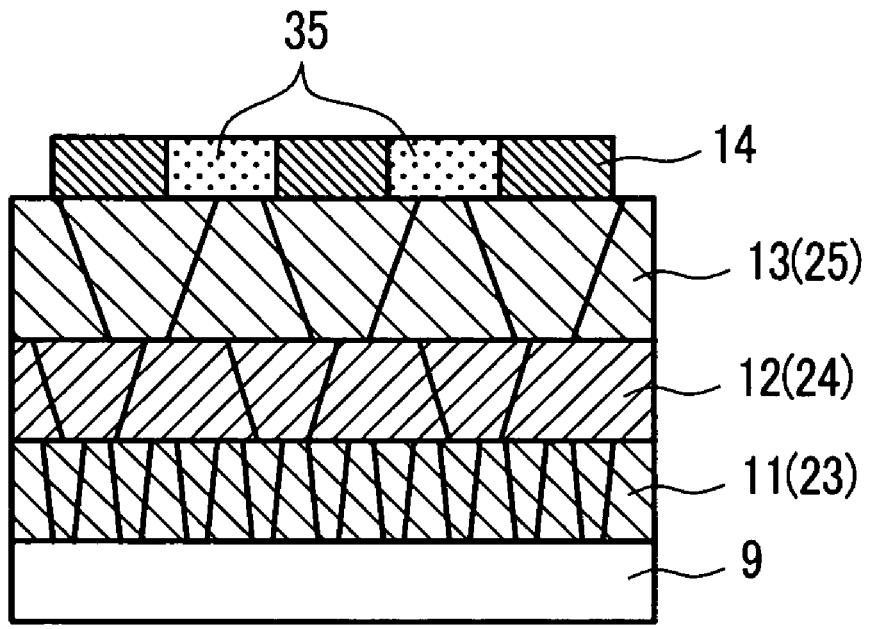
FIG. 9A and FIG. 9B are views for explaining a developing step of a photoresist film formed on the reflective electrode in the liquid crystal display device of the embodiment of the present invention.
Figure 9B:
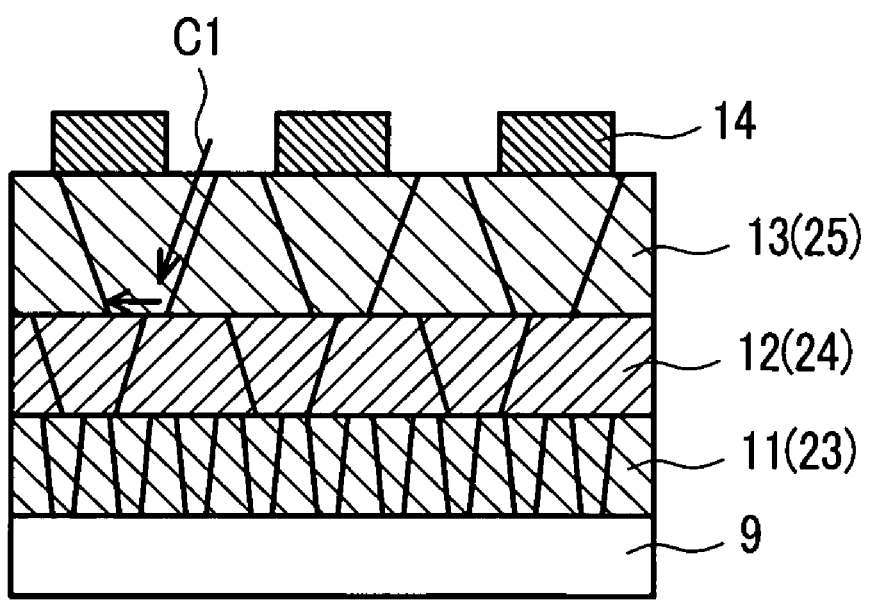

In this case, as shown in FIG. 9A, in the developing step of the photoresist film 14 shown in FIG. 7A, an unexposed portion 35 of the photoresist film 14 is removed using an alkaline developer.

Here, as indicated by an arrow C1 in FIG. 9B, the discontinuous grain boundary which is formed between the upper layer of the second-layer reflective electrode (Al alloy film) 12(24) and the lower layer of the third-layer reflective electrode (Al alloy film) 13(25) prevents the intrusion of the alkaline developer into the ITO film which constitutes the film below the transparent electrode 9. Accordingly, it is possible to prevent the dissolution of the ITO film which constitutes the transparent electrode 9.

Further, by forming the second-layer reflective electrode 12(24) and the third-layer reflective electrode 13(25) using the same material, these reflective electrodes can be formed in the same film forming chamber and hence, although the second-layer reflective electrode 12(24) and the third-layer reflective electrode 13(25) are formed, this does not push up the cost of the film forming device.

Figure 10:
FIG. 10 is a photograph showing the grain boundaries formed by each reflective electrode in the liquid crystal display device of the embodiment of the present invention.

FIG. 10 shows a microscope photograph of the grain boundaries which are formed between the second-layer reflective electrode (Al alloy film) 12(24) and the third-layer reflective electrode (Al alloy film) 13(25) in this embodiment.

It is understood that the discontinuous grain boundaries are formed in a portion surrounded by a bold line indicated by an arrow D1 in FIG. 10.

Figure 11A:
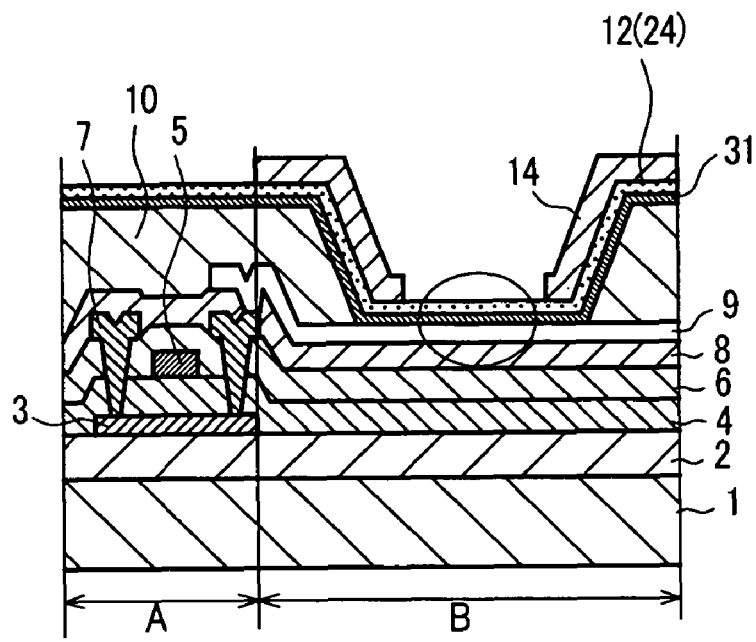
FIG. 11A and FIG. 11B are views for explaining grain boundaries formed between a protective metal film and the reflective electrode described in the previously described patent literature 1.
Figure 11B:
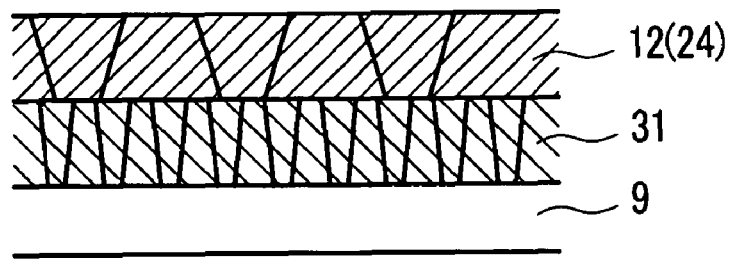

FIG. 11A and FIG. 11B are views for explaining the grain boundaries which are formed between the protective metal film and the reflective electrode described in the previously-mentioned patent literature 1.

FIG. 11A shows the developing step of the photoresist film 14 corresponding to FIG. 7A in this embodiment and FIG. 11B is a view which shows a portion which is surrounded by a circle in FIG. 11A in an enlarged manner.

As shown in FIG. 11B, in the method described in the previously-mentioned patent literature 1, the first-layer reflective electrode (Al alloy film) 12(24) is formed on the protective metal film (Mo alloy film) 31.

Accordingly, although the grain boundaries are formed between the protective metal film 31 and the reflective electrode 12(24), the Mo alloy film which constitutes the protective metal film 31 has smaller crystals than the Al alloy film 24 which constitutes the reflective electrode 12 and hence, a plurality of grain boundaries of the Mo alloy film exist with respect to one grain boundary of the Al alloy film whereby an effect to impede the intrusion of the developer is insufficient.

This point is explained using FIG. 12A and FIG. 12B hereinafter.

As shown in FIG. 12A, in the developing step of the photoresist film 14 corresponding to FIG. 7A, a portion 35 of the photoresist film 14 which is not exposed is removed by an alkaline developer.

Figure 12B:
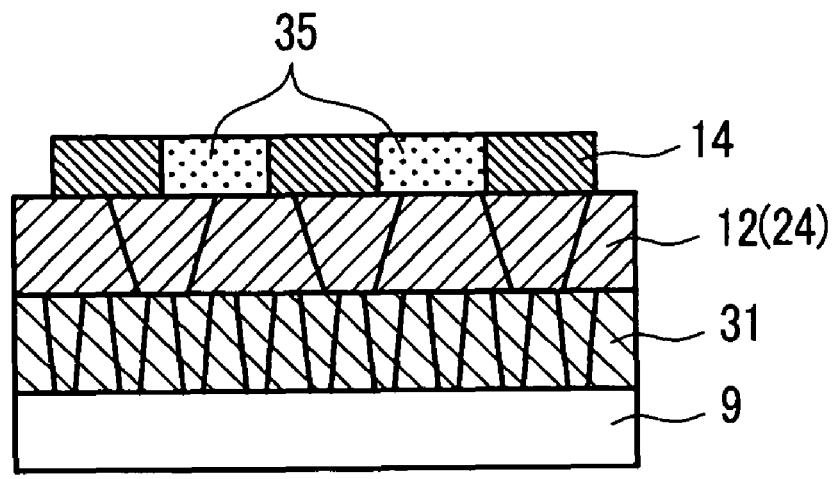
Figure 12B:
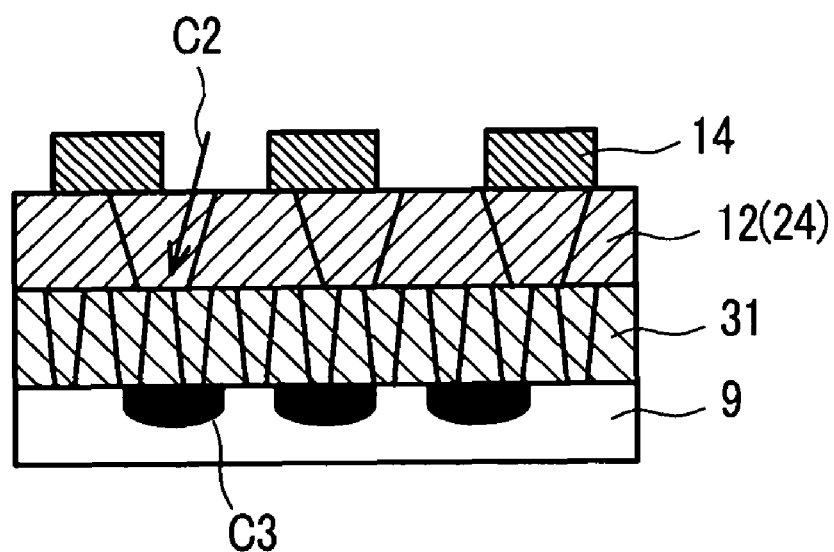

However, as indicated by an arrow C2 in FIG. 12B, the alkaline developer passes through gaps of the grain boundaries formed in the reflective electrode (Al alloy film) 12(24) and gaps of the grain boundaries formed in the protective metal film (Mo alloy film) 31 and intrudes the ITO film which constitutes the lower-layer transparent electrode 9 and dissolves the ITO film as indicated by an arrow C3 in FIG. 12B.

In this manner, the method described in the previously-mentioned patent literature 1 cannot prevent the deterioration of the transparent conductive film attributed to the cell reaction.

Figure 13:
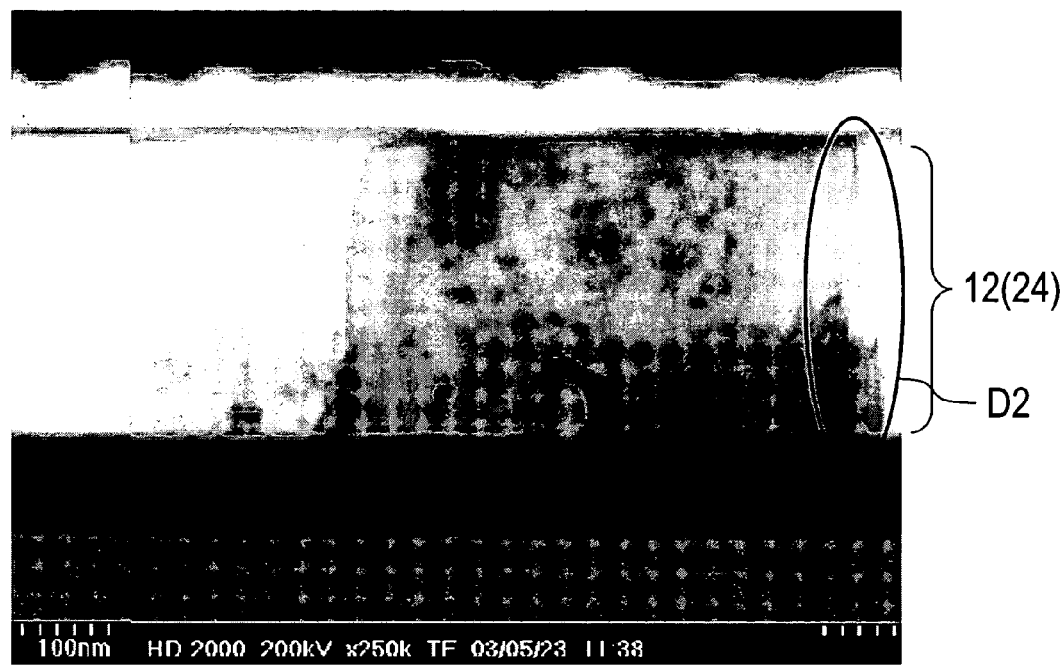
FIG. 13 is a photograph showing grain boundaries formed between reflective electrodes of a conventional liquid crystal display device.

FIG. 13 shows a microscope photograph of the grain boundary which is formed in the reflective electrode (Al alloy film) 12 described in the previously-mentioned patent literature 1. It is understood that the grain boundaries are formed in a portion surrounded by a bold line indicated by an arrow D2 in FIG. 13.

As has been explained heretofore, according to this embodiment, by forming the reflective electrode to have the three-layered structure in which the reflective electrode is divided into three layers consisting of the first-layer reflective electrode (Mo alloy film) 11, the second-layer reflective electrode (Al alloy film) 12 and the third-layer reflective electrode (Al alloy film) 13, the discontinuous grain boundaries are formed on the interface between the upper layer of the second-layer reflective electrode (Al alloy film) 12 and the lower layer of the third-layer reflective electrode (Al alloy film) 13.

Due to the existence of the discontinuous grain boundaries, it is possible to prevent the intrusion of the alkaline developer into the ITO film which constitutes the lower-layer transparent electrode 9 whereby the dissolution of the ITO film which constitutes the transparent electrode 9 can be prevented thus enhancing a yield rate.

Further, by forming the second-layer reflective electrode 12 and the third-layer reflective electrode 13 using the same material, these reflective electrodes 12, 13 can be formed as films in the same film forming chamber and hence, even when the second-layer reflective electrode 12 and the third-layer reflective electrode 13 are formed as in the case of the method described in the previously-mentioned patent literatures 2, 3, this does not push up the cost of the film forming device.

Further, the previously-mentioned respective patent literatures 2, 3 completely fail to disclose the electrode structure which features the present invention, that is, the electrode structure having the four-layered structure which is constituted of the third-layer reflection electrode (Al alloy film)/second-layer reflection electrode (Al alloy film)/first-layer reflection electrode (Mo alloy film)/transparent electrode (ITO film).

Here, in the above-mentioned explanation, the explanation has been made with respect to the case in which the Mo alloy film which constitutes the conductive background layer is used as the first-layer reflective electrode 11, the present invention is not limited to such a case. That is, provided that the first-layer reflective electrode 11 is formed of a film which contains anyone of Mo, Ti, Ta as a main component (for example, a Mo film, a Ti film, a Ta film, a Mo alloy film, a Ti alloy film, a Ta alloy film), it is possible to obtain the substantially equal advantageous effects. Accordingly, it is possible to obtain the favorable contact between the ITO film and the Al alloy film.

Further, this first-layer reflective electrode 11 can be omitted.

In the same manner, in the above-mentioned explanation, although the explanation has been made with respect to the case in which the Al alloy film is used as the second-layer and third-layer reflective electrodes (12, 13), the present is not limited to such a case. That is, provided that the second-layer and third-layer reflective electrodes (12, 13) are formed of a film which contains Al as the main component such as an Al film, it is possible to obtain the substantially equal advantageous effects.

Further, the transparent electrode 9 is not limited to the ITO film and may be formed of a transparent conductive film which contains indium oxide as a main component.

Further, in the above-mentioned explanation, the explanation has been made with respect to the case in which the present invention is applied to the reflective electrode of the partial-transmissive-type liquid crystal display device, the present invention is not limited such a case. That is, it is apparent that the present invention is also applicable to the electrode structure (or the wiring structure) in which a film containing Al as a main component is formed on a transparent conductive film containing indium oxide as a main component and, thereafter, to perform the patterning, a photo resist film is applied and sensitized by exposure using a coating and developing device and, thereafter, an electrode pattern is formed using an alkaline developer.

Accordingly, the present invention is also applicable to other display device having the above-mentioned electrode structure (or the wiring structure) (for example, an organic EL display device or the like).

Although the inventions made by inventors of the present inventions have been specifically explained in conjunction with the above-mentioned embodiment, it is needless to say that the present inventions are not limited to the above-mentioned embodiment and various modifications can be made without departing from the gist of the present inventions.

What is claimed is:

1. A display device comprising:
   a first conductive layer which is formed of a transparent conductive film containing indium oxide as a main component;
   a conductive background layer which is formed on the first conductive layer;

a second conductive layer which is formed of a film on the conductive background layer, the second conductive layer being formed of a first group of materials, the first group of materials containing Al as a main component; and a third conductive layer which is formed on the second conductive layer, the third conductive layer being formed of a second group of materials, wherein the first group of materials is the same as the second group of materials, and wherein on an interface between the second conductive layer and the third conductive layer, positions of grain boundaries are arranged discontinuously so as to prevent the intrusion of alkaline developer and the dissolution of the first conductive layer.

2. A display device according to claim 1, wherein the conductive background layer is a film which contains any one of Mo, Ti and Ta as a main component.

3. A display device according to claim 1, wherein the third conductive layer is a reflective electrode.

4. A display device according to claim 1, wherein
the first conductive layer is in contact with the conductive background layer,
the conductive background layer is in contact with the second conductive layer, and
the second conductive layer is in contact with the third conductive layer.

5. A display device comprising:
a first conductive layer which is formed of a transparent conductive film containing indium oxide as a main component;
a second conductive layer which is formed of a film on and in physical contact with the first conductive layer, the second conductive layer being formed of a first group of materials, the first group of materials containing Al as a main component; and
a third conductive layer which is formed on the second conductive layer, the third conductive layer being formed of a second group of materials,
wherein the first group of materials is the same as the second group of materials, and
wherein on an interface between the second conductive layer and the third conductive layer, positions of grain boundaries are arranged discontinuously.

6. A display device according to claim 5, wherein the third conductive layer is a reflective electrode.

7. A display device according to claim 5, wherein the second conductive layer is in contact with the third conductive layer.

8. A display device comprising:
a first conductive layer which is formed of a transparent conductive film containing indium oxide as a main component;
a conductive background layer which is formed on the first conductive layer, the conductive background layer being formed of one of Mo, Ti, and Ta as a main component;
a second conductive layer which is formed of a film on the background layer, the second conductive layer being formed of a first group of materials, the first group of materials containing Al as a main component; and
a third conductive layer which is formed on the second conductive layer continuously, the third conductive layer being formed of a second group of materials and being a reflective electrode,
wherein the first group of materials is the same as the second group of materials, and on an interface between the second conductive layer and the third conductive layer, positions of grain boundaries are arranged discontinuously so as to prevent the intrusion of alkaline developer and the dissolution of the first conductive layer.

9. A display device according to claim 8, wherein
the first conductive layer is in contact with the conductive background layer,
the conductive background layer is in contact with the second conductive layer, and
the second conductive layer is in contact with the third conductive layer.

\* \* \* \* \*